(12) United States Patent
Aichi et al.

(10) Patent No.: US 11,227,811 B2
(45) Date of Patent: Jan. 18, 2022

(54) HEAT RADIATING MEMBER AND ELECTRICAL JUNCTION BOX

(71) Applicant: Sumitomo Wiring Systems, Ltd., Mie (JP)

(72) Inventors: Junya Aichi, Mie (JP); Jun Ikeda, Mie (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 47 days.

(21) Appl. No.: 16/665,407

(22) Filed: Oct. 28, 2019

(65) Prior Publication Data

US 2020/0152544 A1   May 14, 2020

(30) Foreign Application Priority Data

Nov. 9, 2018   (JP) .............................. JP2018-211604

(51) Int. Cl.
| | |
|---|---|
| *H01L 23/32* | (2006.01) |
| *H01L 23/50* | (2006.01) |
| *H01L 25/07* | (2006.01) |
| *H01L 23/367* | (2006.01) |
| *H01L 23/36* | (2006.01) |

(52) U.S. Cl.
CPC .......... *H01L 23/3672* (2013.01); *H01L 23/50* (2013.01); *H01L 25/072* (2013.01); *H01L 23/36* (2013.01)

(58) Field of Classification Search
CPC ... H01L 23/3672; H01L 23/50; H01L 25/072; H01L 23/36
See application file for complete search history.

(56) References Cited

U.S. PATENT DOCUMENTS

| | | | |
|---|---|---|---|
| 6,853,068 B1 | 2/2005 | Djekic | |
| 7,035,105 B2 * | 4/2006 | Yamaguchi | ......... B60R 16/0238 |
| | | | 165/80.3 |
| 7,417,873 B2 * | 8/2008 | Kadoya | ............ B29C 45/14377 |
| | | | 257/E21.504 |

(Continued)

FOREIGN PATENT DOCUMENTS

| | | |
|---|---|---|
| CN | 106507651 A | 3/2017 |
| DE | 102014105594 A1 | 10/2015 |

(Continued)

OTHER PUBLICATIONS

German Office Action, Application No. 10 2019 129 948.9, dated Dec. 28, 2020.

*Primary Examiner* — Ida M Soward
(74) *Attorney, Agent, or Firm* — Honigman LLP (57) ABSTRACT

A heat radiating member and an electrical junction box are provided that have a simple configuration and are capable of quickly radiating heat generated by a semiconductor device. A support member, which receives heat from a substrate portion having a mounting face on which a semiconductor device is mounted, via an opposing plate portion opposing the mounting face, and radiates the received heat, includes a recessed portion formed in the opposing plate portion, at a position corresponding to the semiconductor device. The recessed portion has a wall thickness that is greater than that of another portion of the opposing plate portion.

4 Claims, 8 Drawing Sheets

(56) References Cited

U.S. PATENT DOCUMENTS

| | | | | |
|---|---|---|---|---|
| 8,604,606 B2* | 12/2013 | Eom | ................... | H01L 25/165 |
| | | | | 257/706 |
| 9,064,758 B2* | 6/2015 | Yano | ................... | H01L 23/057 |
| 10,438,862 B2* | 10/2019 | Morimoto | ............... | H01L 23/66 |
| 10,520,167 B2* | 12/2019 | Duckworth | ........... | F21V 29/763 |
| 10,524,339 B2* | 12/2019 | Hung | ................... | H05B 39/085 |
| 10,591,120 B2* | 3/2020 | Bailey | ..................... | F21V 5/04 |
| 10,816,148 B2* | 10/2020 | Danesh | ................ | F21V 23/006 |
| 11,051,430 B2* | 6/2021 | Shibata | .............. | H05K 7/20454 |
| 2008/0285271 A1* | 11/2008 | Roberge | .................. | F21S 8/06 |
| | | | | 362/235 |
| 2011/0228498 A1* | 9/2011 | Kawai | ............... | H05K 7/20409 |
| | | | | 361/752 |
| 2015/0173243 A1* | 6/2015 | Chauhan | ............ | H05K 7/20336 |
| | | | | 165/104.26 |
| 2019/0319440 A1* | 10/2019 | Haraguchi | ............... | H05K 1/18 |
| 2020/0154604 A1* | 5/2020 | Sylvestre | .................. | H03L 1/04 |
| 2020/0194159 A1* | 6/2020 | Tsuchida | ................ | H01F 27/02 |
| 2020/0352056 A1* | 11/2020 | Yoshida | ................ | H05K 7/205 |

FOREIGN PATENT DOCUMENTS

| | | |
|---|---|---|
| JP | 2005129820 A | 5/2005 |
| JP | 201279741 A | 4/2012 |
| JP | 2018-063982 A | 4/2018 |
| WO | 2016163135 A1 | 10/2016 |

\* cited by examiner

HEAT RADIATING MEMBER AND ELECTRICAL JUNCTION BOX

CROSS-REFERENCE TO RELATED APPLICATIONS

This application claims priority of Japanese Patent Application No. JP 2018-211604 filed on Nov. 9, 2018, the contents of which are incorporated herein.

TECHNICAL FIELD

The present disclosure relates to a heat radiating member for radiating heat of a substrate, and an electrical junction box.

BACKGROUND

Conventionally, substrates are generally known on which a conductive member (which is also referred to as a bus bar etc.) is mounted that constitutes a circuit for letting a relatively large current flow.

JP 2018-063982A discloses an electrical device in which a hole is formed in a housing thereof in order to quickly discharge heat generated by an electrical component provided in the housing to the outside thereof, and to take outside air into the housing to cool the electrical component.

JP 2018-063982A is an example of related art.

In the above-described circuit structure, a large current flows through an electronic component such as a semiconductor device, and thus, a large amount of heat is generated in such an electronic component and a conductive member. The thus-generated heat may cause a malfunction of the electronic component, and there is also concern that secondary harmful effects of heat will be exerted on peripheral electronic components or the like.

In the electronic device in JP 2018-063982A, to address this problem, a hole is formed in the housing. However, due to a hole being formed in the housing, there is concern that dust, water, or the like will enter the housing from outside. To prevent such entrance of dust, water, or the like, the electronic device in Patent Document 1 is separately provided with a filter, which results in a complex configuration and an increase in manufacturing costs.

The present disclosure has been made in view of the foregoing situation, and aims to provide a heat radiating member and an electrical junction box that have a simple configuration and are capable of quickly radiating heat generated by a semiconductor device.

SUMMARY

A heat radiating member according to an aspect of the present disclosure is a heat radiating member that receives heat from a substrate portion having a mounting face on which a semiconductor device is mounted, via an opposing plate portion opposing the mounting face, and radiates the received heat, the heat radiating member including: a recessed portion formed in the opposing plate portion, at a position corresponding to the semiconductor device, wherein the recessed portion has a wall thickness that is greater than that of another portion of the opposing plate portion.

An electrical junction box according to an aspect of the present disclosure includes: the above-described heat radiating member; an accommodating portion for accommodating the substrate portion; and a heat conductive material interposed between the substrate portion and the opposing plate portion of the heat radiating member.

According to an aspect of the present disclosure, heat generated by a semiconductor device can be quickly radiated with a simple configuration.

EMBODIMENTS OF THE DISCLOSURE

First, embodiments of the present disclosure will be listed and described. At least some of the following embodiments may also be combined in any manner.

A heat radiating member according to an aspect of the present disclosure is a heat radiating member that receives heat from a substrate portion having a mounting face on which a semiconductor device is mounted, via an opposing plate portion opposing the mounting face, and radiates the received heat, the heat radiating member including: a recessed portion formed in the opposing plate portion, at a position corresponding to the semiconductor device, wherein the recessed portion has a wall thickness that is greater than that of another portion of the opposing plate portion.

According to this aspect, the recessed portion is formed at a position corresponding to the semiconductor device. The recessed portion covers the semiconductor device, and has a wall thickness that is larger than that of another portion of the opposing plate portion.

That is to say, the recessed portion, which is provided near the semiconductor device, has a large wall thickness and thus has a large heat capacity. If heat is generated by the semiconductor device, a large amount of heat can be received from the semiconductor device, and the heat radiation effect can be enhanced.

In the heat radiating member according to an aspect of the present disclosure, a wall portion of the recessed portion excluding a bottom portion has a wall thickness that is greater than that of another portion of the opposing plate portion.

According to this aspect, the wall portion of the recessed portion excluding the bottom portion thereof has a large wall thickness. Accordingly, it is possible to receive a large amount of heat generated by the semiconductor device to enhance the heat radiation effect, and also to suppress an increase in the weight of the heat radiating member.

In the heat radiating member according to an aspect of the present disclosure, an elongated wall portion of a wall portion of the recessed portion excluding a bottom portion, the elongated wall portion extending in a longitudinal direction of the recessed portion, has a wall thickness that is greater than that of another portion of the opposing plate portion.

According to this aspect, the elongated wall portion of the wall portion of the recessed portion excluding the bottom portion thereof has a large wall thickness. That is to say, only the elongated wall portion, which occupies the majority of the wall portion, is thick. Accordingly, it is possible to effectively receive a large amount of heat generated by the semiconductor device to enhance the heat radiation effect, and to further suppress an increase in the weight of the heat radiating member itself.

The heat radiating member according to an aspect of the present disclosure further includes a radiation fin that is flush with an outer face of the elongated wall portion and is continuous with an end portion of the elongated wall portion.

According to this aspect, the elongated wall portion and the radiation fins are continuous with each other in one direction. Accordingly, heat from the semiconductor device that is received by the elongated wall portion is quickly transmitted to the radiation fins at the shortest distance.

An electrical junction box according to an aspect of the present disclosure includes: any one of the above-described heat radiating members; an accommodating portion configured to accommodate the substrate portion; and a heat conductive material interposed between the substrate portion and the opposing plate portion of the heat radiating member.

According to this aspect, the heat conductive material is interposed between the substrate portion and the opposing plate portion of the heat radiating member. Heat generated by the semiconductor device is conducted to the substrate portion, and is quickly conducted to the opposing plate portion via the heat conductive material. Then, this heat is radiated from the radiation fins via the recessed portion into outside air.

Details of Embodiments of the Present Disclosure

The present disclosure will be described in detail based on the drawings that illustrate the embodiments thereof. A heat radiating member and an electrical junction box according to the embodiments of the present disclosure will be described below with reference to the drawings. Note that the present disclosure is not limited to those examples, but is described by the claims and is intended to encompass all modifications made within the meanings and scope equivalent to the claims.

The following description will take, as an example, an electrical device (electrical junction box) that includes a heat radiating member according to the embodiments.

Embodiment 1

Figure 1:
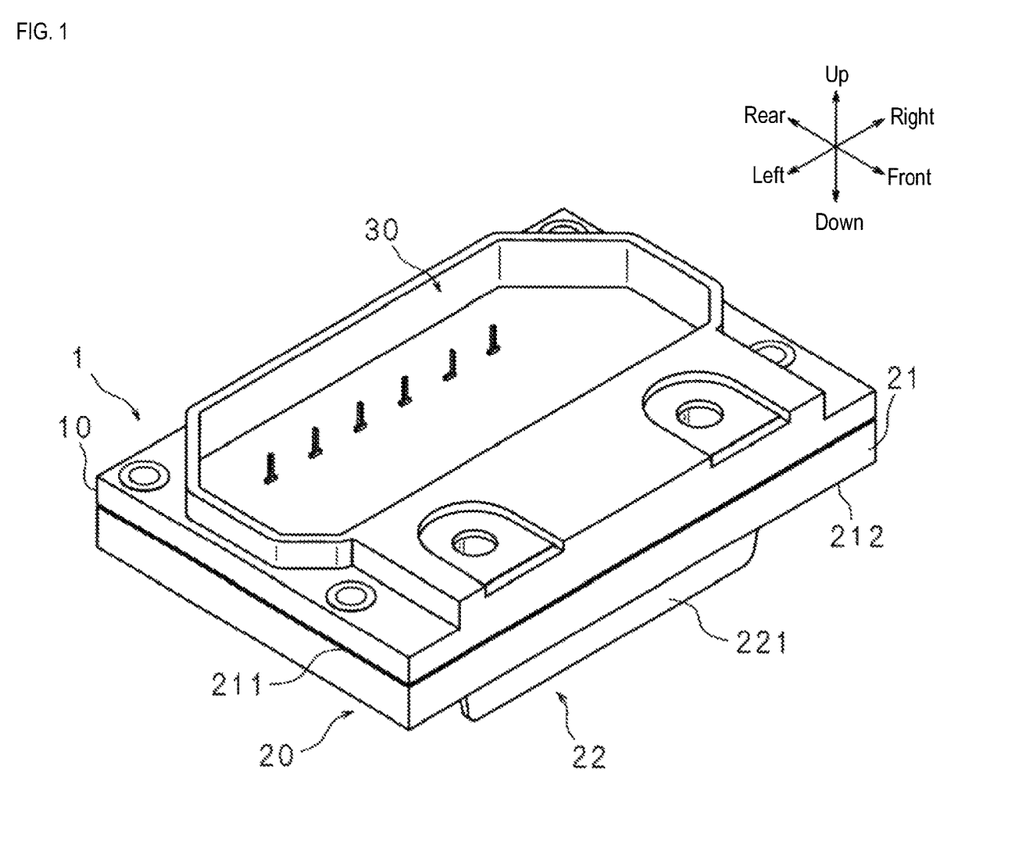
FIG. 1 is a perspective view of an electrical device according to an embodiment.

FIG. 1 is a perspective view of an electrical device 1 according to this embodiment. The electrical device 1 includes a substrate accommodating portion 10, and a support member 20 (heat radiating member) for supporting the substrate accommodating portion 10.

The electrical device 1 is an electrical junction box that is to be arranged in a power supply path between a power supply such as a battery provided in a vehicle and an in-vehicle electrical equipment such as a lamp or a wiper, or a load that is constituted by a motor or the like. The electrical device 1 is used as, for example, an electronic component such as a DC-DC converter or an inverter, for example.

In this embodiment, "front", "rear", "left", "right", "upper", and "lower" sides of the electrical device 1 are defined by the frontward, rearward, leftward, rightward, upward, and downward directions indicated in FIG. 1. A configuration of the electrical device 1 will be described below using the frontward, rearward, leftward, rightward, upward, and downward directions that are thus defined.

Figure 2:
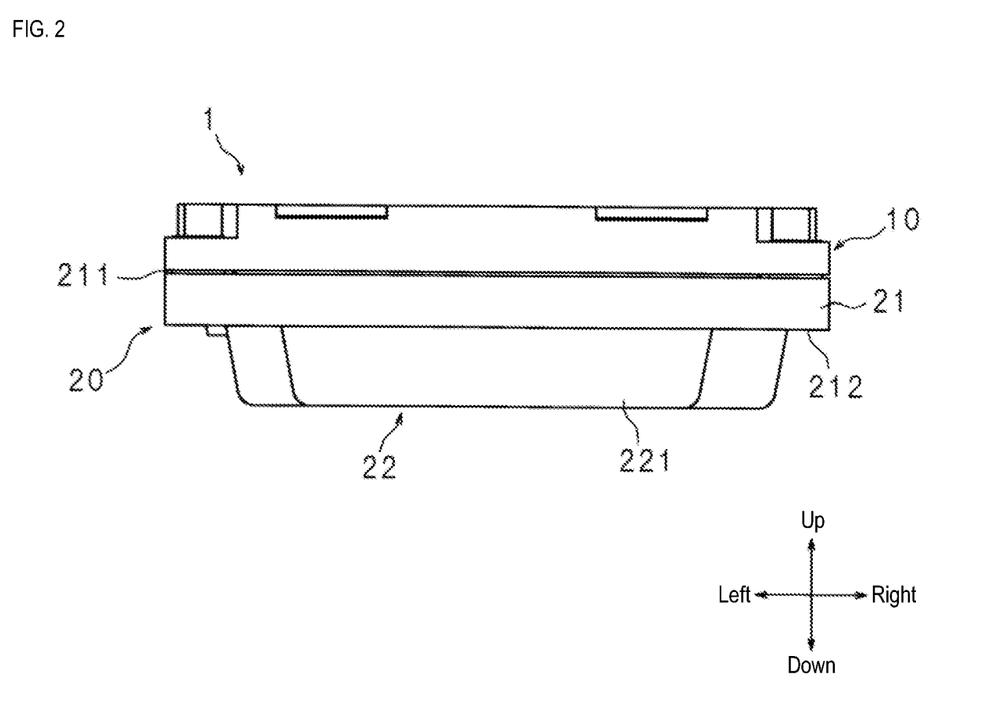
FIG. 2 is a schematic front elevational view of the electrical device according to an embodiment.
Figure 3:
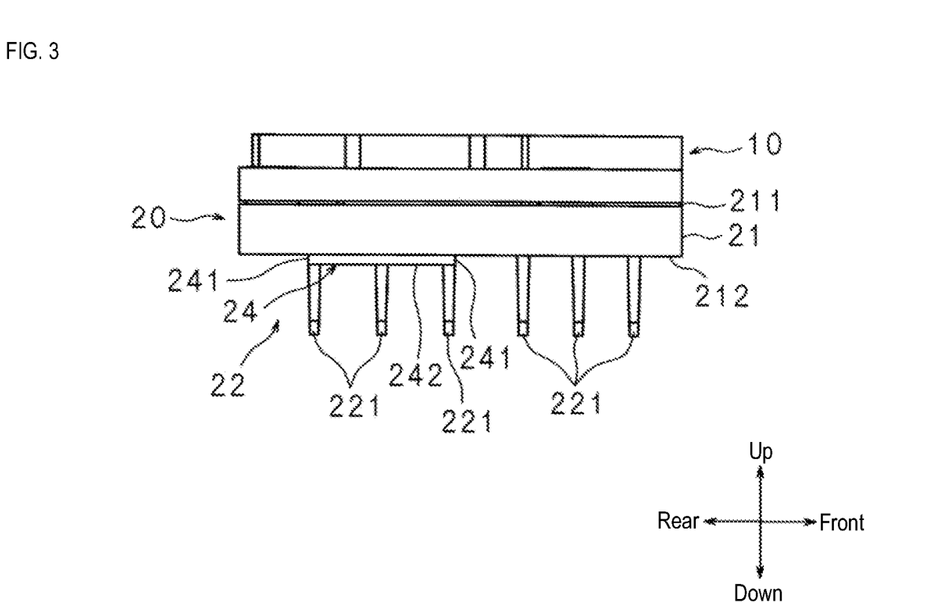
FIG. 3 is a schematic side view of the electrical device according to an embodiment.
Figure 4:
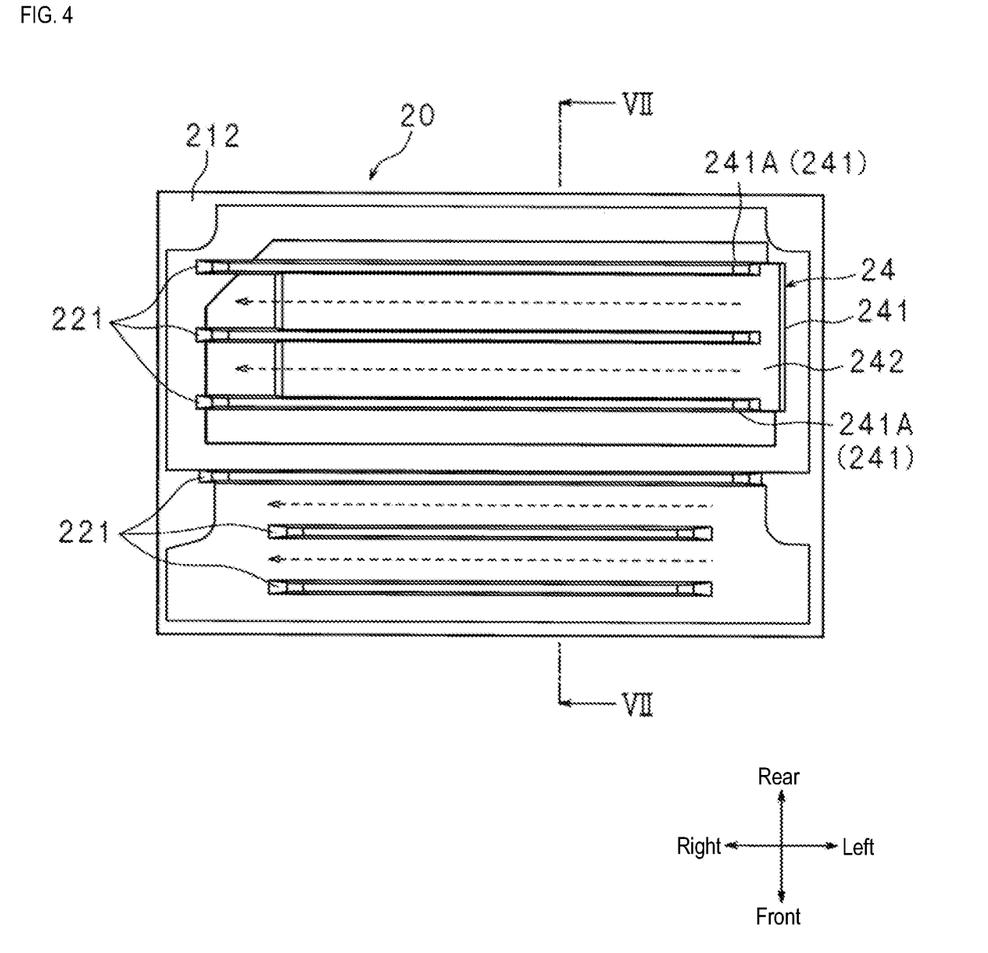
FIG. 4 is a schematic bottom view of the electrical device according to an embodiment.
Figure 5:
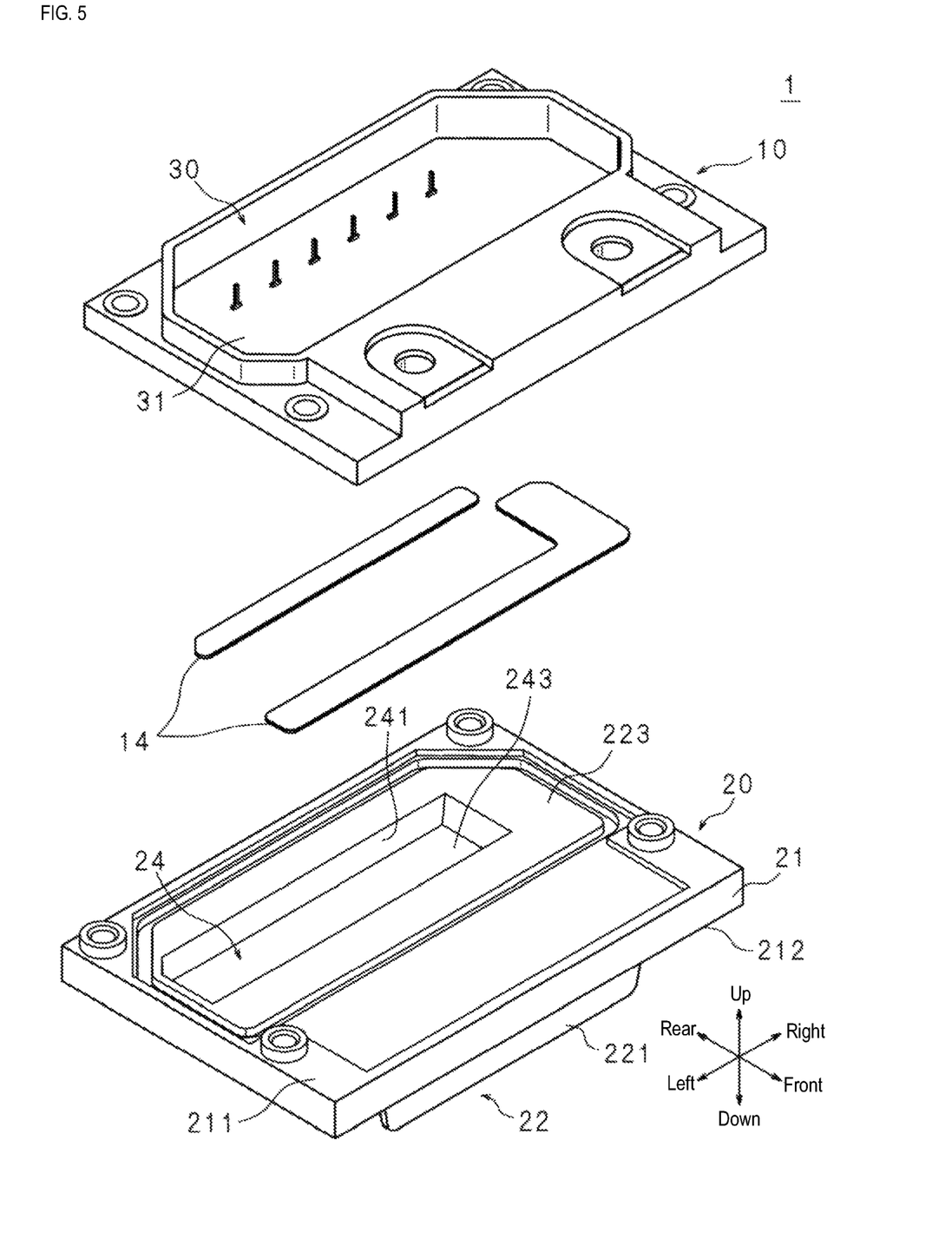
FIG. 5 is an exploded view of the electrical device according to an embodiment.

FIG. 2 is a schematic front elevational view of the electrical device 1 according to this embodiment. FIG. 3 is a schematic side view of the electrical device 1 according to this embodiment. FIG. 4 is a schematic bottom view of the electrical device 1 according to this embodiment. FIG. 5 is an exploded view of the electrical device 1 according to this embodiment.

The substrate accommodating portion 10 includes a substrate portion 31, which constitutes a power circuit, and an electronic component that is mounted in the substrate portion 31. This electronic component is mounted as appropriate in accordance with the usage of the electrical device 1, and may include a switching element such as an FET (Field Effect Transistor), a resistor, a coil, a capacitor, or the like.

The support member 20 includes a base portion 21 for supporting the substrate accommodating portion 10 at a circumferential edge 211 on the upper side of the base portion 21, and a heat radiating portion 22, which is provided on a lower face 212 on the side opposite to the circumferential edge 211. The base portion 21 and the heat radiating portion 22 included in the support member 20 are integrally formed by die-casting using a metallic material such as aluminium or an aluminium alloy, for example.

Figure 6:
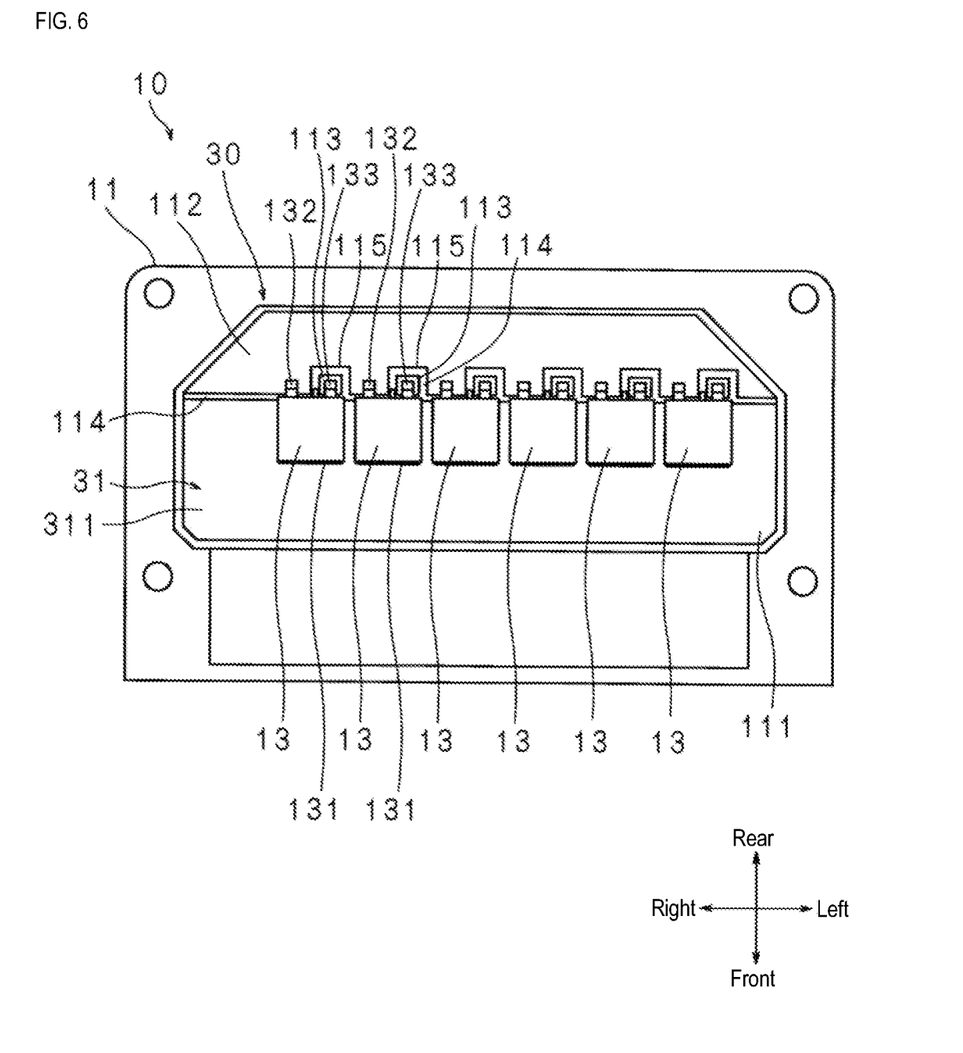
FIG. 6 is a schematic bottom view of a substrate accommodating portion of the electrical device according to an embodiment.

FIG. 6 is a schematic bottom view of the substrate accommodating portion 10 of the electrical device 1 according to this embodiment. That is to say, FIG. 6 shows the substrate accommodating portion 10 as viewed from below.

The substrate accommodating portion 10 includes a power circuit 30. The power circuit 30 at least includes the substrate portion 31, which includes bus bars 111 to 113, and semiconductor switching devices 13 (semiconductor devices), which are mounted on a mounting face 311 provided on the lower side of the substrate portion 31.

The semiconductor switching devices 13 are FETs (more specifically, power MOSFETs of a surface mounting type), for example, and are mounted on the lower side of the bus bars 111 to 113. An electronic component such as a Zener diode may also be mounted in addition to the semiconductor switching devices 13 (hereinafter, FETs 13) on the lower side of the bus bars 111 to 113.

Each of the FETs 13 includes a drain terminal 131 on a lower face (i.e. a face opposing the mounting face 311) of its device body, for example. The drain terminal 131 protrudes toward one side of the device body. Also, each of the FETs 13 includes a source terminal 132 and a gate terminal 133 on the other side that opposes the one side.

The drain terminal 131 of each of the FETs 13 is soldered to the bus bar 111. Hereinafter, the bus bar 111 will be referred to as a drain bus bar 111. Also, the source terminal 132 of each of the FETs 13 is soldered to the bus bar 112. Hereinafter, the bus bar 112 will be referred to as a source bus bar 112. The drain bus bar 111 and the source bus bar 112 are conductive plate members that are made of a metallic material such as copper or a copper alloy.

Meanwhile, the gate terminal 133 of each of the FETs 13 is soldered to the bus bar 113. Hereinafter, the bus bar 113 will be referred to as a gate bus bar 113. The gate bus bar 113 is a conductive member that is made of a metallic material such as copper or a copper alloy.

A resin portion 114, which is made of an insulating resin material, is interposed between the drain bus bar 111 and the source bus bar 112, between the source bus bar 112 and the gate bus bar 113, and between the gate bus bar 113 and the drain bus bar 111. The drain bus bar 111, the source bus bar 112, and the gate bus bar 113 are integrated with the resin portions 114, constituting the substrate portion 31.

A plurality of FETs 13 are mounted on the mounting face 311 on the lower side of the substrate portion 31. That is to say, the lower faces of the source bus bar 112 and the gate bus bar 113 and a portion of the gate bus bar 113 are flush with each other, constituting the mounting face 311 of the substrate portion 31. The plurality of FETs 13 are arranged in parallel in a line in the mounting face 311 in the longitudinal direction (left-right direction) of the substrate portion 31.

The resin portions 114 are manufactured by insert molding using an insulating resin material, such as phenol resin or glass epoxy resin, for example. The resin portions 114 integrate the drain bus bar 111, the source bus bar 112, and the gate bus bar 113 with each other by engaging these bus bars with each other, and the substrate portion 31 is thus constituted thereby. Also, portions of the resin portions 114 are arranged between the drain bus bar 111 and the source bus bar 112, between the source bus bar 112 and the gate bus bar 113, and between the gate bus bar 113 and the drain bus bar 111, thereby insulating these bus bars from each other.

In the support member 20, the base portion 21 is a rectangular flat plate member that has an appropriate thickness. Screw holes for fixing the substrate accommodating portion 10 are formed in the circumferential edge 211 of the base portion 21. For example, the substrate accommodating portion 10 is fixed to the support member 20 (base portion 21) by screwing.

In the base portion 21, an opposing plate portion 223 is formed inward of the circumferential edge 211, at a position opposing the mounting face 311 of the substrate portion 31 in the vertical direction. The opposing plate portion 223 has a shape that follows the mounting face 311 of the substrate portion 31, and the upper face of the opposing plate portion 223 that opposes the mounting face 311 is flat.

A recessed portion 24 is provided on the inner side of the opposing plate portion 223, and is recessed downward. The recessed portion 24 is provided at a position opposing, in the vertical direction, the aforementioned plurality of FETs 13, which are arranged in a line. That is to say, in the opposing plate portion 223, an area corresponding to the line of the plurality of FETs 13 arranged in parallel is recessed to form the recessed portion 24. Thus, a portion of the lower face of the opposing plate portion 223 that corresponds to the recessed portion 24 protrudes downward.

The recessed portion 24 is provided so as to form a substantially rectangular shape as viewed in the vertical direction such that the longitudinal direction of the substrate portion 31 is the longitudinal direction of the recessed portion 24. The recessed portion 24 has a bottom portion 243, and a wall portion 241, which excludes the bottom portion 243. The wall portion 241 stands in a direction intersecting the opposing plate portion 223.

In a state where the substrate accommodating portion 10 is fixed to the support member 20, all of the FETs 13 are accommodated in the recessed portion 24. In other words, the recessed portion 24 covers all of the FETs 13 (see FIG. 7).

Figure 7:
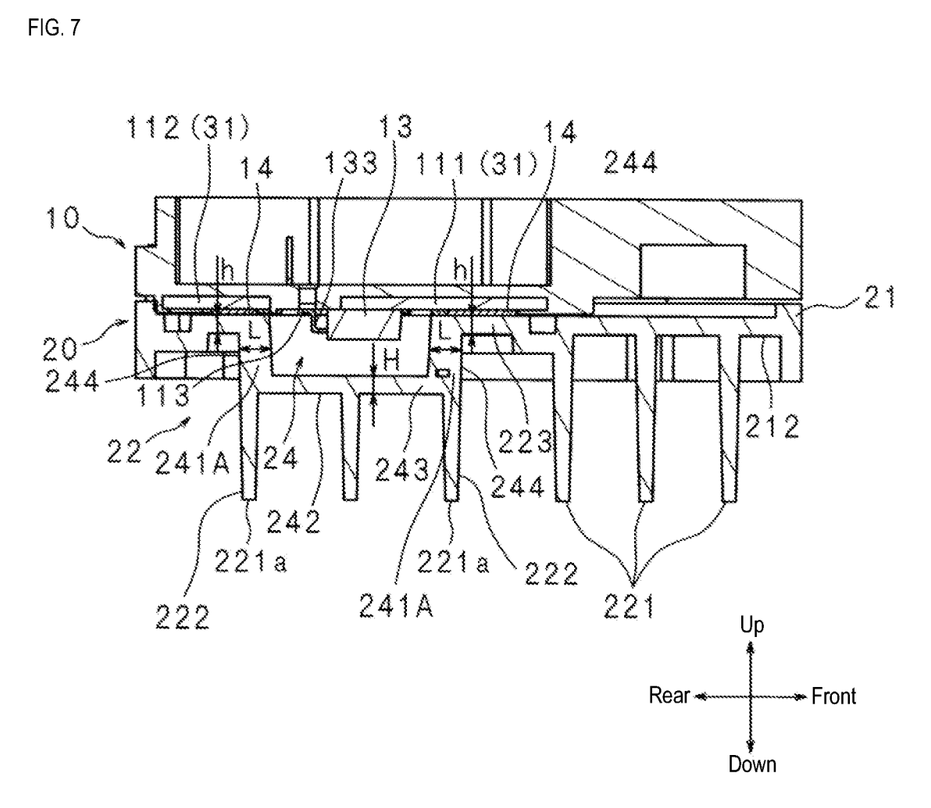
FIG. 7 is a vertical cross-sectional view of FIG. 4 taken along line VII-VII.

A first heat conductive material 14 is interposed between the opposing plate portion 223 and the substrate portion 31. The first heat conductive material 14 is grease, a heat conductive sheet, or the like that has good heat conductivity, for example. The first heat conductive material 14 is arranged in a portion of the opposing plate portion 223 other than the recessed portion 24, and the opposing plate portion 223 is in contact with the mounting face 311 of the substrate portion 31 via the first heat conductive material 14. That is to say, the first heat conductive material 14 is in contact with both the mounting face 311 for the FETs 13 in the substrate portion 31 and the opposing plate portion 223. If heat is generated by the FETs 13, this heat is conducted to the substrate portion 31 (mounting face 311), and is transmitted via the first heat conductive material 14 to the opposing plate portion 223. Accordingly, the first heat conductive material 14 can readily and quickly transmit heat generated by the FETs 13 to the base portion 21 (opposing plate portion 223).

The heat radiating portion 22 is provided on the lower side of the base portion 21. The heat radiating portion 22 is provided with a plurality of radiation fins 221, which protrude downward from the lower face 212 of the base portion 21, receives heat generated by the substrate accommodating portion 10 (e.g. the FETs 13), and radiates the heat into the outside air. That is to say, heat of the FETs 13 that is transmitted via the first heat conductive material 14 to the opposing plate portion 223 (substrate portion 31) is air-cooled via the radiation fins 221.

The radiation fins 221 extend in the left-right direction, i.e. in the longitudinal direction of the recessed portion 24. The plurality of radiation fins 221 are arranged in parallel with a space therebetween in the front-rear direction. Note that the radiation fins 221 are also provided outside the recessed portion 24.

That is to say, a protruding portion is formed in the lower face of the opposing plate portion 223 due to the recessed portion 24 being recessed downward, as mentioned above. In this protruding portion, a protruding end face 242 on the protruding side thereof, i.e. an outer face of the bottom portion 243 of the recessed portion 24 is flat, and is provided with the radiation fins 221 similarly to portions other than the protruding end face 242.

The base portion 21, the opposing plate portion 223 (recessed portion 24), and the radiation fins 221 are integrally formed by die-casting using a metallic material, such as aluminium or an aluminium alloy, for example.

In the heat radiating portion 22, air flows between the radiation fins 221 along the radiation fins 221. In contrast, if the wall portion 241 is provided such that the direction in which the radiation fins 221 extend (hereinafter, "the longitudinal direction of the radiation fins 221") and the wall portion 241 of the recessed portion 24 intersect each other, air flowing along the radiation fins 221 in the longitudinal direction of the radiation fins 221 will be interrupted by the wall portion 241. Then, air will not flow smoothly in the heat radiating portion 22, and the heat radiation properties of the heat radiating portion 22 will deteriorate.

In this regard, in the electrical device 1 according to this embodiment, the recessed portion 24 has a rectangular shape as viewed in the vertical direction, and thus, the longitudinal direction of the recessed portion 24 and the longitudinal direction of the radiation fins 221 coincide with each other. That is to say, in the electrical device 1 according to this embodiment, the plurality of radiation fins 221 are arranged in parallel such that elongated wall portions 241A of the wall portion 241 that extend in the longitudinal direction of the recessed portion 24 coincide with the longitudinal direction of the radiation fins 221, and the wall portion 241 of the recessed portion 24 is kept from intersecting the longitudinal direction of the radiation fins 221. Accordingly, air flows between the elongated wall portions 241A and the radiation fins 221, the flow of air flowing along the radiation fins 221 is not interrupted by the wall portion 241, and deterioration of the heat radiation properties of the heat radiating portion 22 can be prevented in advance (see broken lines in FIG. 4).

FIG. 7 is a vertical cross-sectional view of FIG. 4 taken along line VII-VII.

As mentioned above, the recessed portion 24 that covers all of the FETs 13 is formed in the opposing plate portion 223, and radiation fins 221 and 221a are provided in the protruding end face 242 of the bottom portion 243 of the recessed portion 24. Other portions of the opposing plate portion 223, i.e. portions other than the recessed portion 24 are in contact with the mounting face 311 of the substrate portion 31 via the first heat conductive material 14.

In the electrical device 1 according to this embodiment, at least the wall thickness L of two elongated wall portions 241A extending in the longitudinal direction of the recessed portion 24, of the wall portion 241 of the recessed portion 24, is greater than the wall thickness h of the other portions of the opposing plate portion 223. Also, the wall thickness L of the elongated wall portions 241A of the recessed portion 24 is greater than the wall thickness H of the bottom portion 243.

Thus, since the wall thickness L of the elongated wall portions 241A of the recessed portion 24 is large, base portions of the elongated wall portions 241A, i.e. upper end portions of the elongated wall portions 241A are also thick. Accordingly, heat conduction toward the elongated wall portions 241A via the other portions of the opposing plate portion 223 that are in contact with the substrate portion 31 is facilitated. In addition, the large thickness of the elongated wall portions 241A increases heat capacity, and a large amount of heat can be received. That is to say, the elongated wall portions 241A can quickly receive a large amount of heat from the substrate portion 31 and transmit the received heat to the radiation fins 221 and 221a.

The above description has taken, as an example, the case where the wall thickness L of the two elongated wall portions 241A is greater than the wall thicknesses H and h of the other portions of the opposing plate portion 223, but the electrical device 1 according to this embodiment is not limited thereto. A configuration may also be employed in which the wall thickness of other areas of the wall portion 241, in addition to the elongated wall portions 241A, is also greater than the other portions of the opposing plate portion 223.

Also, the electrical device 1 according to this embodiment is not limited thereto, and the wall thickness H of the bottom portion 243 of the recessed portion 24, in addition to the elongated wall portions 241A, may also be greater than the wall thickness h of the other portions of the opposing plate portion 223.

In the electrical device 1 according to this embodiment, only the two elongated wall portions 241A of the wall portion 241 of the recessed portion 24 have a wall thickness L that is greater than the wall thicknesses H and h of the other portions of the opposing plate portion 223. Accordingly, it is possible to achieve an effect of quickly receiving a large amount of heat from the substrate portion 31 and transmitting the received heat to the radiation fins 221 and 221a, as well as a reduction in the weight of the electrical device 1.

In the electrical device 1 according to this embodiment, the radiation fins 221a, which are integrated with the elongated wall portions 241A, are provided in the protruding end face 242 on the outer side of the recessed portion 24. More specifically, the radiation fins 221a are provided in the protruding end face 242 and below the two respective elongated wall portions 241A. In other words, the radiation fins 221a are provided at respective end portions of the protruding end face 242 and at positions that match the two respective elongated wall portions 241A in a direction intersecting the opposing plate portion 223. The radiation fins 221a are continuous with lower end portions of the respective elongated wall portions 241A.

Here, one face 222 of each of the radiation fins 221a is flush with an outer face 244 of the corresponding elongated wall portion 241A.

For example, in FIG. 7, a right face 222 of the radiation fin 221a on the right side in the diagram, of the two radiation fins 221a, is flush with the outer face 244 of the elongated wall portion 241A on the right side in the diagram, of the two elongated wall portions 241A.

Due to this configuration, in the electrical device 1 according to this embodiment, a large amount of heat received from the substrate portion 31 by the elongated wall portions 241A is quickly transmitted to the radiation fins 221a.

That is to say, in the electrical device 1 according to this embodiment, each of the elongated wall portions 241A and the corresponding radiation fin 221a are continuous with each other on a line in a direction intersecting the opposing plate portion 223, and the outer face 244 of each of the elongated wall portions 241A and the one face 222 of the corresponding radiation fin 221a are flush and integrated with each other. Accordingly, heat conducted to the upper end portions of the elongated wall portions 241A is conducted to leading ends of the radiation fins 221a at the shortest distance.

The above description has taken, as an example, the case where the wall thickness L of the elongated wall portions 241A is fixed in the vertical direction, but the electrical device 1 according to this embodiment is not limited thereto. A configuration may also be employed in which the wall thickness L of the elongated wall portions 241A decreases from the upper end portions toward the lower end portions thereof.

In this case, heat conduction from the substrate portion 31 to the elongated wall portions 241A is facilitated, and a reduction in the weight of the electrical device 1 can also be achieved.

Embodiment 2

Figure 8:
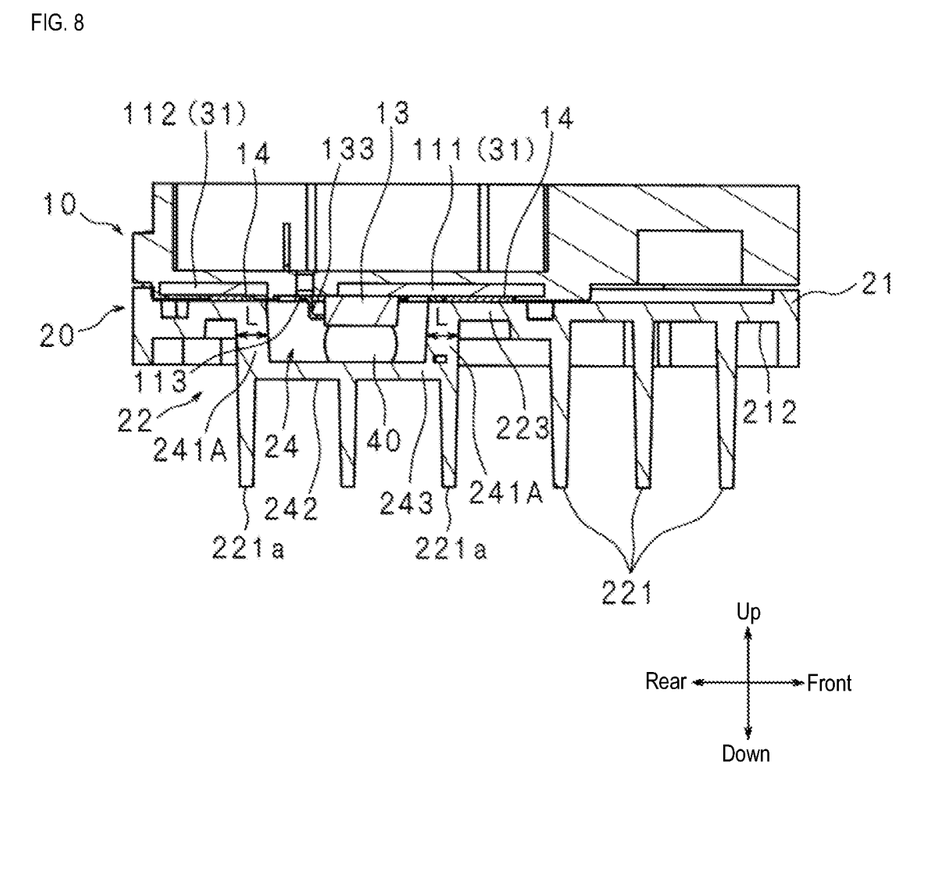
FIG. 8 is a partial vertical cross-sectional view illustrating the relationship between a recessed portion and an FET in the electrical device according to an embodiment.

FIG. 8 is a partial vertical cross-sectional view illustrating the relationship between the recessed portion 24 and the FETs 13 in the electrical device 1 according to this embodiment.

Similarly to Embodiment 1, all of the FETs 13 are covered by the recessed portion 24. Furthermore, in this embodiment, a second heat conductive material 40 is interposed between the FETs 13 and an inner face of the recessed portion 24. The second heat conductive material 40 is grease, a heat conductive sheet, or the like that has good heat conductivity, for example. The second heat conductive material 40 is in contact with lower faces of the FETs 13 and the inner face of the recessed portion 24, and transmits heat generated by the FETs 13 to the recessed portion 24, for example.

Thus, in the electrical device 1 according to this embodiment, if the FETs 13 generate heat, this heat is quickly conducted via the second heat conductive material 40 to the recessed portion 24. Then, the radiation fins 221 and 221a receive heat via the wall portion 241 and the bottom portion 243 of the recessed portion 24 to air-cool the heat. Accordingly, heat generated by the FETs 13 can be radiated more effectively.

Portions similar to those of Embodiment 1 are assigned the same signs, and a description thereof is omitted.

The embodiments disclosed at this time are examples in all aspects, and should be considered to be not restrictive. The scope of the present disclosure is indicated not by the above-described meanings but by the claims, and is intended to include all modifications within the meanings and scope equivalent to the claims.

What is claimed is:

1. An electrical junction box comprising:
   a heat radiating member that receives heat from a substrate portion having a mounting face on which a semiconductor device is mounted, via an opposing plate portion opposing the mounting face, and radiates the received heat, the heat radiating member including:
   a recessed portion formed in the opposing plate portion, at a position corresponding to the semiconductor device, wherein the recessed portion has a wall thickness that is greater than that of another portion of the opposing plate portion;
   an accommodating portion configured to accommodate the substrate portion; and
   a heat conductive material interposed between the substrate portion and the opposing plate portion of the heat radiating member.

2. The electrical junction box as set forth in claim 1, wherein a wall portion of the recessed portion excluding a bottom portion has a wall thickness that is greater than that of another portion of the opposing plate portion.

3. The electrical junction box as set forth in claim 1, wherein an elongated wall portion of a wall portion of the recessed portion excluding a bottom portion, the elongated wall portion extending in a longitudinal direction of the recessed portion, has a wall thickness that is greater than that of another portion of the opposing plate portion.

4. The electrical junction box as set forth in claim 1, further comprising:
   a radiation fin that is flush with an outer face of the elongated wall portion and is continuous with an end portion of the elongated wall portion.

* * * * *